United States Patent
Chung et al.

(10) Patent No.: US 12,176,443 B2
(45) Date of Patent: *Dec. 24, 2024

(54) ELECTRONIC SENSOR DEVICES AND METHODS OF MANUFACTURING ELECTRONIC SENSOR DEVICES

(71) Applicant: Amkor Technology Singapore Holding Pte. Ltd., Singapore (SG)

(72) Inventors: Ji Young Chung, Gyeonggi-Do (KR); Sung Hwan Yang, Incheon (KR); Jae Ho Lee, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/889,161

(22) Filed: Aug. 16, 2022

(65) Prior Publication Data
US 2022/0393039 A1  Dec. 8, 2022

Related U.S. Application Data

(62) Division of application No. 16/707,114, filed on Dec. 9, 2019, now Pat. No. 11,437,526.

(51) Int. Cl.
*H01L 31/02* (2006.01)
*H01L 31/0203* (2014.01)
(Continued)

(52) U.S. Cl.
CPC .... *H01L 31/02002* (2013.01); *H01L 31/0203* (2013.01); *H01L 31/186* (2013.01); *H01L 31/1876* (2013.01); *G06V 40/1318* (2022.01)

(58) Field of Classification Search
CPC .......... H01L 31/02002; H01L 31/0203; H01L 31/186; H01L 31/1876; H01L 23/488;
(Continued)

(56) References Cited

U.S. PATENT DOCUMENTS

| 6,603,183 B1 | 8/2003 | Hoffman |
| 7,045,396 B2 * | 5/2006 | Crowley .......... H01L 23/49551 |
| | | 257/E23.047 |

(Continued)

FOREIGN PATENT DOCUMENTS

| CN | 107045992 A | 8/2017 |
| CN | 207367978 U | 5/2018 |

(Continued)

OTHER PUBLICATIONS

Office Action for Taiwan Application No. 109142237 Apr. 19, 2024.
(Continued)

*Primary Examiner* — Duy T Nguyen
(74) *Attorney, Agent, or Firm* — Spectrum IP Law Group LLC

(57) ABSTRACT

In one example, an electronic device includes: an electronic component comprising a sensor and an electrical interconnect; a substrate comprising an electrically conductive material and a translucent mold compound, wherein the electrically conductive material is coupled to the translucent mold compound and wherein the electrical interconnect of the electronic component is coupled to the electrically conductive material of the substrate; and a translucent underfill contacting the electrical interconnect and between the translucent mold compound and the sensor. Other examples and related methods are also disclosed herein.

18 Claims, 8 Drawing Sheets

(51) Int. Cl.
*H01L 31/18* (2006.01)
*G06V 40/13* (2022.01)

(58) Field of Classification Search
CPC ..... H01L 21/50; H01L 21/56; H01L 23/3185; H01L 23/525; H01L 23/13; H01L 23/31; H01L 24/14; H01L 24/17; G06V 40/1318; G06V 40/1306; G06V 40/12
USPC ........................................................ 438/123
See application file for complete search history.

(56) References Cited

U.S. PATENT DOCUMENTS

| | | | | |
|---|---|---|---|---|
| 8,358,013 | B1 * | 1/2013 | Liou | H01L 23/49575 |
| | | | | 257/777 |
| 8,435,834 | B2 | 5/2013 | Pagaila et al. | |
| 8,912,664 | B1 * | 12/2014 | Liou | H01L 25/105 |
| | | | | 257/777 |
| 9,631,481 | B1 * | 4/2017 | Bae | H01L 23/4952 |
| 2003/0025199 | A1 | 2/2003 | Wu et al. | |
| 2003/0067057 | A1 * | 4/2003 | Wu | H01L 23/49551 |
| | | | | 257/E23.047 |
| 2003/0197290 | A1 * | 10/2003 | Crowley | H01L 25/105 |
| | | | | 257/E23.047 |
| 2005/0133878 | A1 * | 6/2005 | Huang | H01L 31/0203 |
| | | | | 257/433 |
| 2005/0285265 | A1 | 12/2005 | Campbell | |
| 2006/0040106 | A1 * | 2/2006 | Arakawa | B32B 7/023 |
| | | | | 428/411.1 |
| 2007/0273019 | A1 | 11/2007 | Huang et al. | |
| 2008/0308928 | A1 * | 12/2008 | Chang | H01L 27/14618 |
| | | | | 257/723 |
| 2009/0079044 | A1 * | 3/2009 | Wu | H01L 23/49551 |
| | | | | 438/123 |
| 2009/0224386 | A1 * | 9/2009 | Camacho | H01L 21/563 |
| | | | | 257/E23.18 |
| 2010/0308346 | A1 * | 12/2010 | Cheng | G02B 6/0091 |
| | | | | 257/98 |
| 2011/0089438 | A1 * | 4/2011 | Steijer | H05K 3/3463 |
| | | | | 257/82 |
| 2014/0098287 | A1 | 4/2014 | Huang et al. | |
| 2014/0340302 | A1 * | 11/2014 | Sengupta | G06F 3/042 |
| | | | | 29/428 |
| 2015/0145094 | A1 * | 5/2015 | Liu | H01L 25/50 |
| | | | | 257/459 |
| 2017/0263833 | A1 | 9/2017 | Chiu et al. | |
| 2017/0338170 | A1 * | 11/2017 | Ziglioli | H01L 21/565 |
| 2019/0095004 | A1 * | 3/2019 | Son | H01L 23/31 |

FOREIGN PATENT DOCUMENTS

| | | | |
|---|---|---|---|
| JP | 2003298001 | A | 10/2003 |
| JP | 2008001777 | A * | 1/2008 |
| KR | 20110117486 | A | 10/2011 |
| TW | 201927085 | A | 7/2019 |
| WO | WO-2006/022272 | A1 * | 3/2006 |
| WO | 2006065378 | A2 | 6/2006 |

OTHER PUBLICATIONS

Office Action for China Application No. 202011442268.7 mailed Aug. 22, 2024.

* cited by examiner

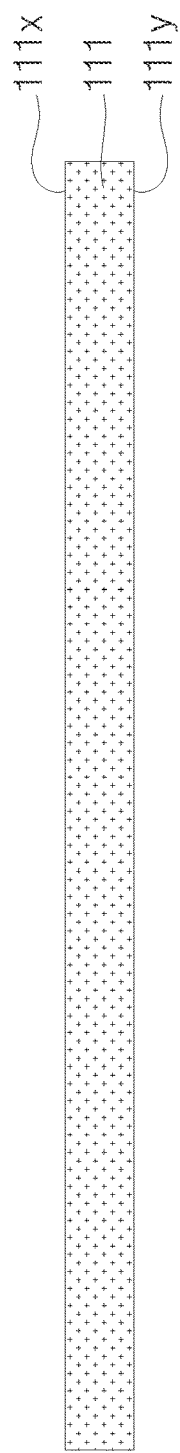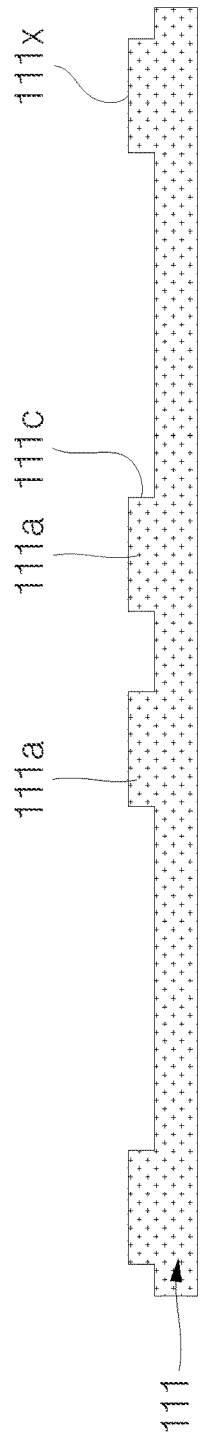

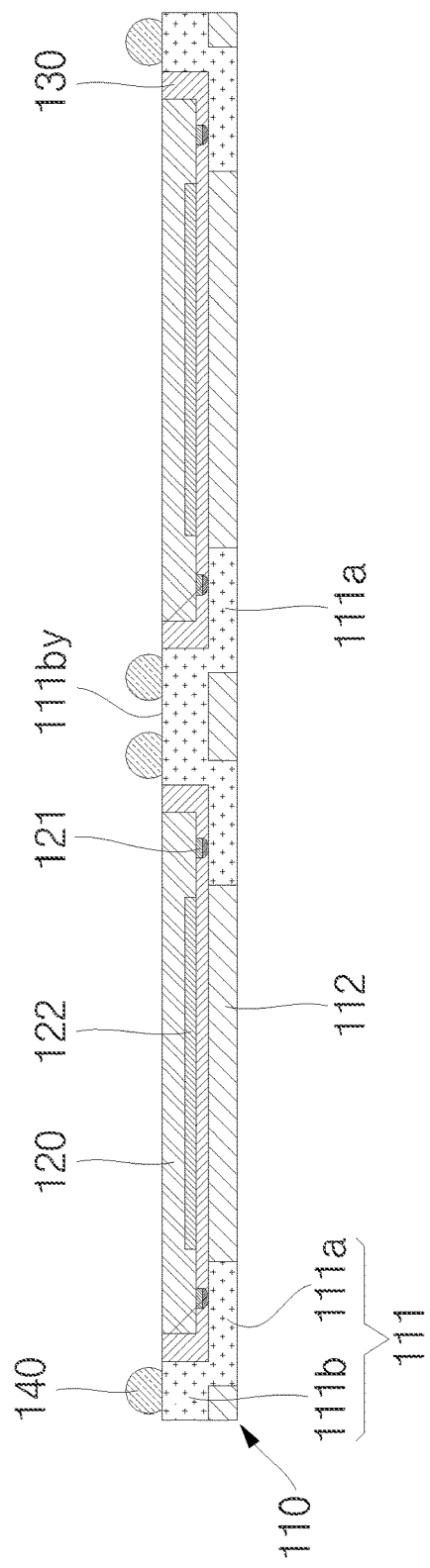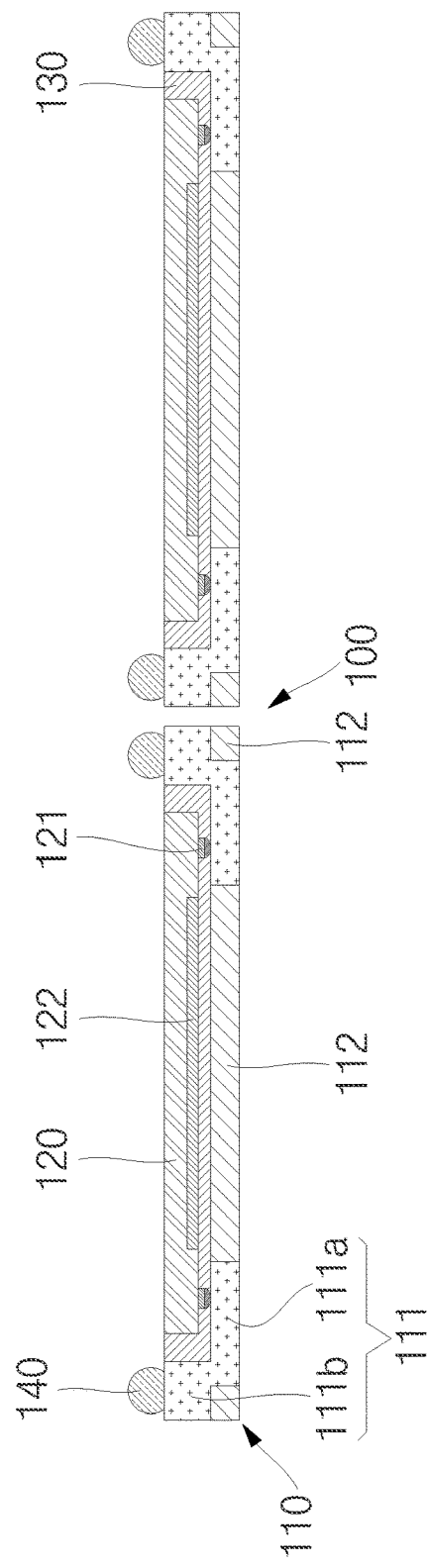

ELECTRONIC SENSOR DEVICES AND METHODS OF MANUFACTURING ELECTRONIC SENSOR DEVICES

CROSS-REFERENCE TO RELATED APPLICATIONS

The present application is a divisional of U.S. application Ser. No. 16/707,114 filed Dec. 9, 2019 (CK-023) now U.S. Pat. No. 11,437,526. Said application Ser. No. 16/707,114 is hereby incorporated herein by reference in its entirety.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2H show cross-sectional views of an example method for manufacturing an example electronic device.

Figure 1:
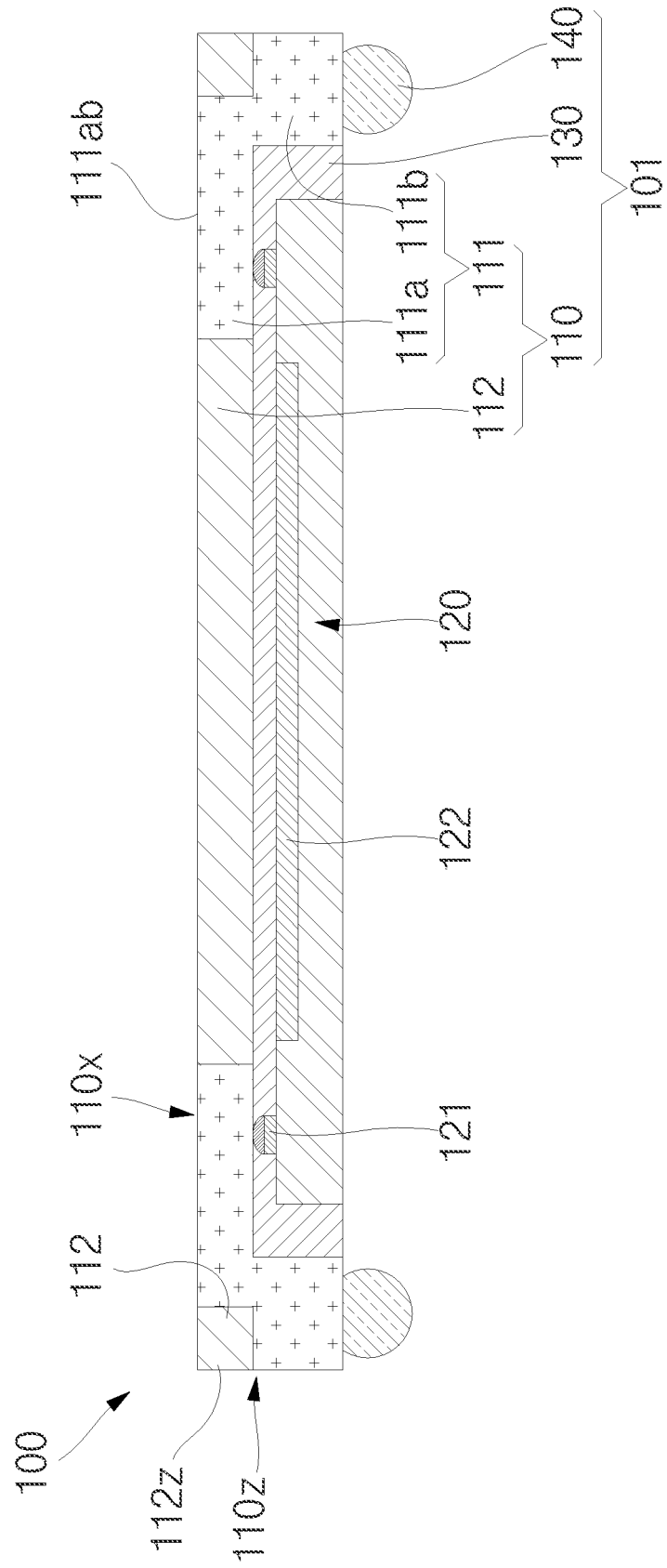
FIG. 1 shows a cross-sectional view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, an electronic device comprises: an electronic component comprising a sensor and an electrical interconnect; a substrate comprising an electrically conductive material and a translucent mold compound, wherein the electrically conductive material is coupled to the translucent mold compound and wherein the electrical interconnect of the electronic component is coupled to the electrically conductive material of the substrate; and a translucent underfill contacting the electrical interconnect and between the translucent mold compound and the sensor.

In another example, a method to manufacture an electronic device comprises: forming a first cavity by removing a first portion of an electrically conductive material; forming a first translucent material in the first cavity; forming a second cavity by removing a second portion of the electrically conductive material; placing a first electronic component in the second cavity, wherein the first electronic component comprises a sensor and an electrical interconnect; and forming a second translucent material in the second cavity contacting the electrical interconnect of the first electronic component and between the sensor of the first electronic component and the first translucent material.

In another example, a method to manufacture an electronic device comprises: providing an electronic component comprising a sensor and an electrical interconnect; providing a substrate comprising an electrically conductive material and a translucent mold compound, wherein the electrically conductive material is coupled to the translucent mold compound and wherein the electrical interconnect of the electronic component is coupled to the electrically conductive material of the substrate; and providing a translucent underfill contacting the electrical interconnect and between the translucent mold compound and the sensor.

Other examples are included in the present disclosure. Such examples may be found in the figures, in the claims, or in the description of the present disclosure.

Figure 1A:
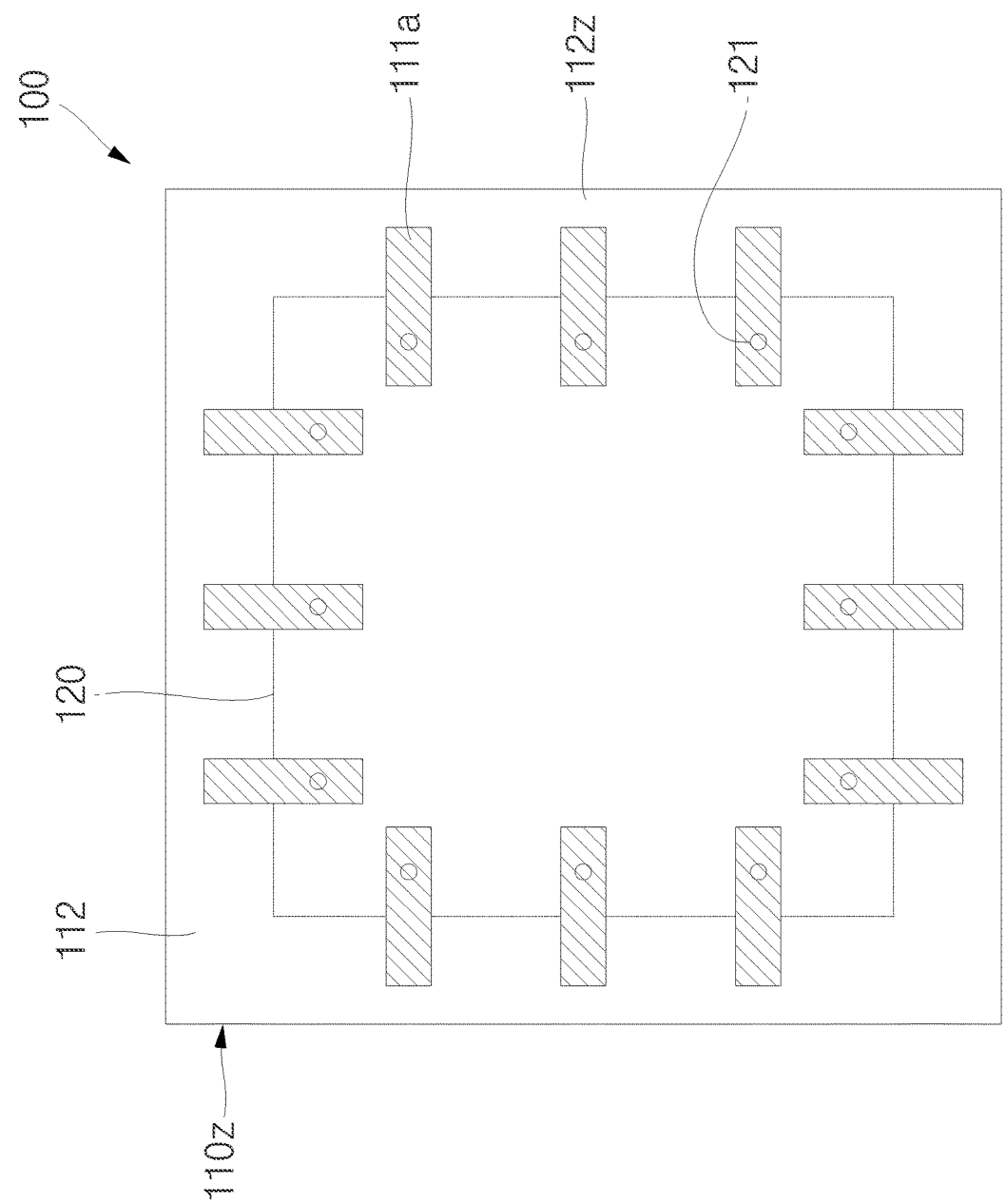
FIG. 1A shows a top view of the example electronic device of FIG. 1.

FIG. 1 shows a cross-sectional view of an example electronic device 100. FIG. 1A shows a top view of the example electronic device 100 of FIG. 1. In the example of FIG. 1, electronic device 100 can comprise substrate 110, electronic component 120, translucent material 130, and external interconnects 140.

Substrate 110 can comprise conductive structure 111 and a translucent material 112. Conductive structure 111 can include conductor 111*ab* comprising lead 111*a* and flank 111*b*. Electronic component 120 can comprise internal interconnects 121 and circuitry 122.

Substrate 110, translucent material 130, and external interconnects 140 can comprise or be referred to as semiconductor package 101 or package 101, and semiconductor package 101 can provide protection for electronic component 120 from external elements or environmental exposure. Semiconductor package 101 can provide electrical coupling between an external component and electronic component 120.

FIGS. 2A to 2H show cross-sectional views of an example method for manufacturing an example electronic device 100.

FIG. 2A shows a cross-sectional view of electronic device 100 at an early stage of manufacture. In the example shown in FIG. 2A, conductive structure 111 can be a substantially planar structure. In some examples, conductive structure 111 can comprise or be referred to as an electrically conductive material, a conductor, a conductive material, a leadframe, or a conductive layer. In some examples, conductive structure 111 can comprise copper (Cu), a copper alloy (comprising nickel (Ni), silicon (Si), palladium (P), or titanium(Ti)), iron-nickel (Fe—Ni) alloy, or copper-steel-copper (Cu/SUS/Cu) metal. In some examples, conductive structure 111 can comprise an electrically conductive leadframe and can include an electrically conductive layer that includes tin, nickel, palladium, gold, or silver plated on side 111x and side 111y for preventing oxidation. Sides can also be referred to as surfaces. In some examples, conductive structure 111 can have a thickness ranging from approximately 80 μm (micrometers) to approximately 800 μm.

FIG. 2B shows a cross-sectional view of electronic device 100 at a later stage of manufacture. In the example shown in FIG. 2B, openings or cavities 111c can be provided or formed by removing portions of conductive structure 111. In some examples, the portions of conductive structure 111 can be removed using an etch process. Side 111y of conductive structure 111 can remain substantially planar. Conductive structure 111 can also comprise multiple leads 111a that upwardly protrude further than the base of cavities 111c. In some examples, a mask pattern (not shown) can be provided on side 111x of conductive structure 111, and exposed portions of conductive structure 111 can be removed by etching to provide multiple leads 111a. In some examples, the mask pattern can be provided using a photoresist. Cavities 111c can be provided between multiple leads 111a by removing portions of conductive structure 111. In some examples, multiple leads 111a can be arranged in a rectangular ring shape and spaced apart from each other. In some examples, leads 111a can comprise or be referred to as electrically conductive leads, conductors, electrically conductive materials, thermally conductive materials, conductive paths, conductive lands, conductive pads, conductive vias, circuit patterns, wiring patterns, trace patterns, conductive posts, conductive lands, wiring pads, or under-bump-metallizations (UBMs). Leads 111a can have a height ranging from approximately 20 μm to approximately 200 μm.

Figure 2C:
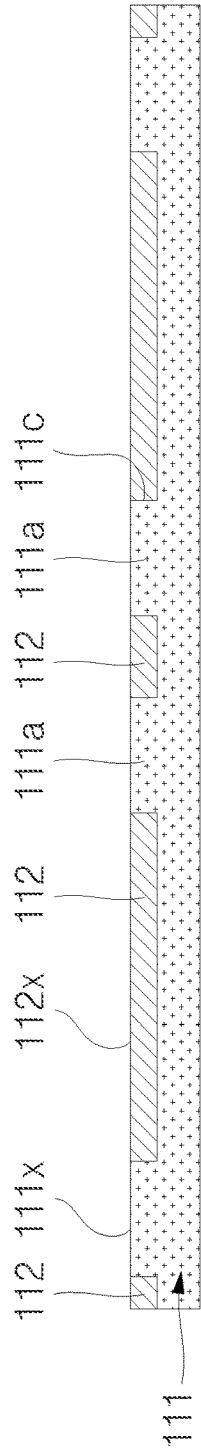

FIG. 2C shows a cross-sectional view of electronic device 100 at a later stage of manufacture. In the example shown in FIG. 2C, translucent material 112 can be provided in cavities 111c of conductive structure 111. In some examples, translucent material 112 can be filled in cavities 111c. In some examples, translucent material 112 can contact conductive structure 111. In some examples, side 112x of dielectric 112 can be substantially coplanar with side 111x of conductive structure 111. In some examples, translucent material 112 can comprise or be referred to as a dielectric, dielectric structure, a dielectric material, a dielectric layer, an insulating layer, a protection layer, or a cover layer. In some examples, dielectric 112 can comprise an electrically insulating material. In some examples, dielectric 112 can comprise a resin, a mold compound, or an epoxy with or without translucent or transparent filler. In some examples dielectric 112 can be clear, translucent, or transparent to permit light or other radiation to pass through and be sensed by circuitry 122. For example, dielectric 112 can comprise a clear, transparent, or translucent resin, mold compound, or epoxy. In some examples, dielectric 112 can be provided by a compression molding process, a transfer molding process, a liquid phase encapsulant molding process, a vacuum lamination process, a paste printing process, or a film assisted molding process. A thickness of dielectric 112 can be the same as, or similar to, that of each of leads 111a.

Figure 2D:
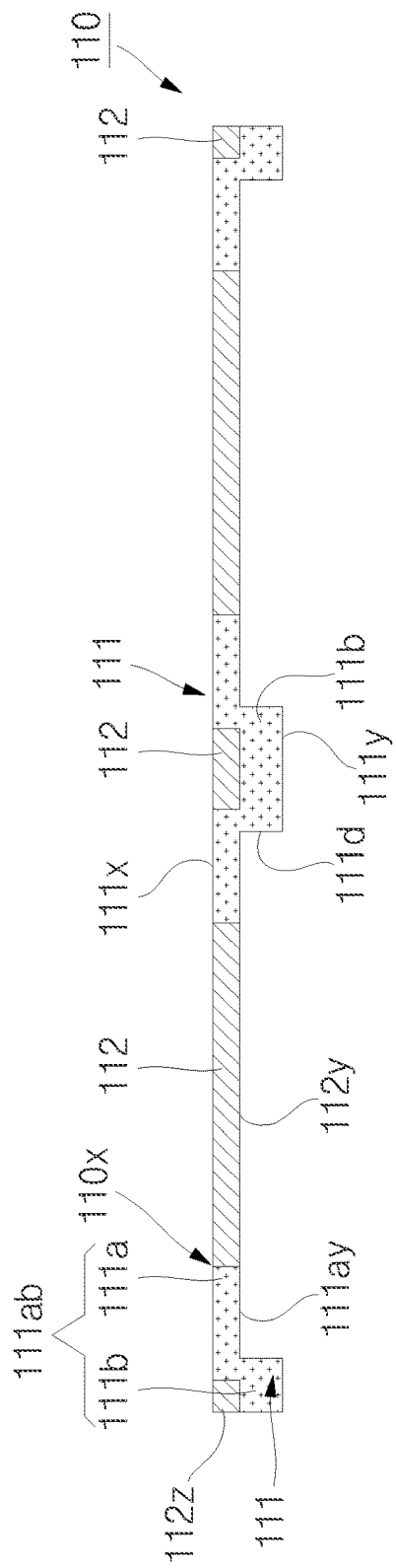

FIG. 2D shows a cross-sectional view of electronic device 100 at a later stage of manufacture. In the example shown in FIG. 2D, openings or cavities 111d can be provided or formed by removing portions of conductive structure 111. In some examples, a mask pattern (not shown) can be provided on side 111y of conductive structure 111, and exposed portions of conductive structure 111 can be removed by etching to provide flanks 111b. In some examples, cavities 111d can be provided between multiple flanks 111b by removing portions of conductive structure 111. Multiple flanks 111b can be arranged in a rectangular ring shape so as to be spaced apart from each other. Each of multiple flanks 111b can be coupled to one or more leads 111a. In some examples, conductor 111ab comprises lead 111a that can be exposed at side 110x of substrate 110, outwardly covered by dielectric edge 112z, or not exposed at lateral side 110z of substrate 110. Side 112y of dielectric 112 can be exposed through cavities 111d of conductive structure 111. A portion of lead base 111ay of lead 111a can also be exposed by cavities 111d of conductive structure 111. In some examples, flanks 111b can comprise or be referred to as conductors, electrically or thermally conductive materials, conductive paths, conductive lands, connecting pads, conductive vias, circuit patterns, wiring patterns, trace patterns, conductive posts, conductive lands, wiring pads, or under-bump-metallizations (UBMs). In some examples, conductor 111ab comprises flank 111b that can be exposed at lateral side 110z of substrate 110, outwardly covered by dielectric edge 112z, and not exposed at side 110x of substrate 110. In some examples, substrate 110 can be referred to as a leadframe. Flanks 111b can have a height in the range from approximately 60 μm to approximately 600 μm.

In some examples, conductive structure 111 can comprise a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be provided by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be provided on the permanent core structure. In some examples, the pre-formed substrate can be a coreless substrate which omits the permanent core structure, and the dielectric and conductive layers can be provided on a sacrificial carrier that can be removed after formation of the dielectric and conductive layers and before attachment to the electronic device. The pre-formed substrate can rereferred to as a printed circuit board (PCB) or a laminate substrate. Such pre-formed substrate can be provided through a semi-additive or modified-semi-additive process. Other substrates in this disclosure can also comprise a pre-formed substrate.

In some examples, substrate 110 can comprise a pre-molded lead frame, a routable molded leadframe, a printed circuit board, a cavity substrate printed circuit board, a multi-layered substrate, a through hole substrate, a rigid substrate, a flexible substrate, a glass epoxy substrate, a polyimide substrate, a molded plastic substrate, a ceramic substrate, an additive process substrate, or a build-up substrate.

Figure 2E:
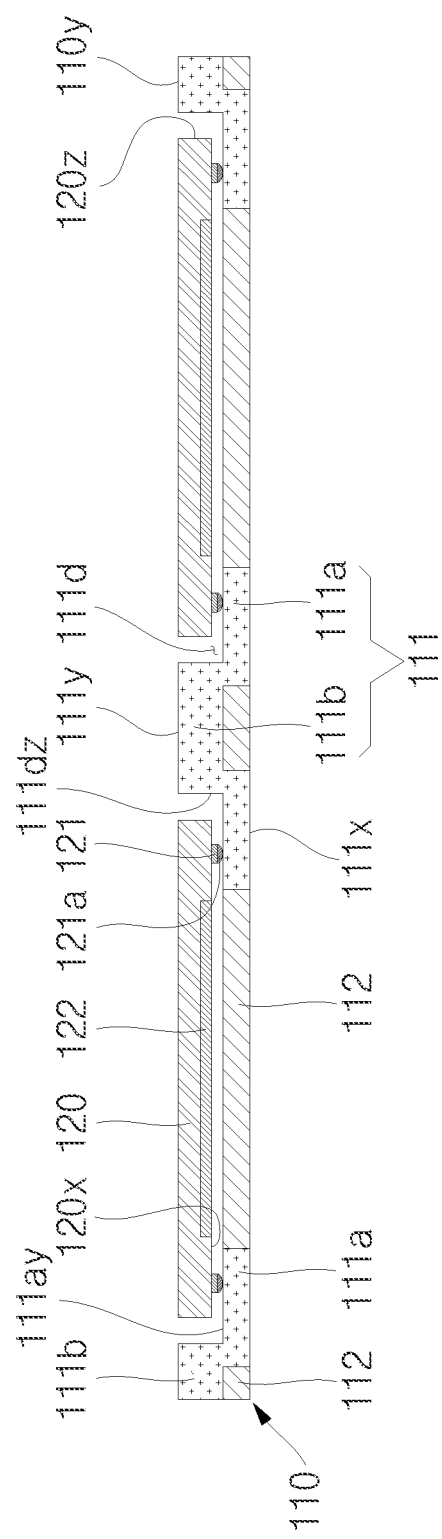

FIG. 2E shows a cross-sectional view of electronic device 100 at a later stage of manufacture. In the example shown in FIG. 2E, the structure of FIG. 2D has been flipped, and electronic component 120 is electrically connected to conductive structure 111 of substrate 110 through internal interconnects 121. In some examples, pick-and-place equipment can pick up electronic component 120 to place electronic component 120 in cavity 111d of substrate 110. Electronic component 120 can be positioned on lead base 111ay of lead 111a. Lateral sides 120z of electronic component 120 can be spaced apart from inner walls 111dz of cavity 111d. Lateral sides 120z of electronic component 120 can be between the top and bottom surfaces of electronic component 120. In some examples, side 120y of electronic component 120 can be referred to as a top surface of electronic component 120 and can be substantially coplanar with side 110y of substrate 110. In some examples, internal interconnects 121 of electronic component 120 can be electrically connected to leads 111a of substrate 110 using a mass reflow process or a thermal compression process. In some examples, electronic component 120 can comprise or be referred to as a semiconductor die or a semiconductor chip. In some examples, electronic component 120 can comprise a semiconductor material such as, for example, silicon (Si). In some examples, electronic component 120 can comprise passive electronic circuit elements (not shown) or active electronic circuit elements (not shown) such as transistors. In some examples, electronic component 120 can be referred to as a semiconductor device.

In some examples, electronic component 120 can comprise or be referred to as a sensor, a micro-electro mechanical system (MEMS)sensor, a light sensor, a fingerprint sensor, a photo sensor, or a pressure sensor. In some examples, electronic component 120 can comprise a transmitter to transmit signals through dielectric 112 or electronic component 120 can comprise a receiver to receive signals transmitted through dielectric 112 to the receiver of electronic component 120.

In some examples, electronic component 120 can comprise an active region and a non-active region. In some examples, the active region can face substrate 110, the base of cavity 111d, or dielectric 112. In some examples, the active region can comprise internal interconnects 121 or circuitry 122 and can be referred to as the sensing side of electronic component 120.

In some examples, internal interconnect 121 can comprise or be referred to as an electrical interconnect, a die pad, a bond pad, an aluminum pad, a conductive pillar, a conductive post, a copper pillar wafer bump, a solder wafer bump, or a solder bump. Internal interconnects 121 can be formed using an electroplating process. In some examples, internal interconnects 121 can comprise an electrically conductive material such as, for example, solder, a metal, copper, aluminum, gold, nickel, a nickel-gold alloy, a copper alloy, an aluminum alloy, a gold alloy, or a nickel alloy Internal interconnects 121 can comprise a low melting point material 121a and can be coupled to leads 111a of substrate 110 through low melting point material 121a. In some examples, low melting point material 121a can comprise Sn, Ag, Pb, Cu, Sn—Pb, Sn37-Pb, Sn95-Pb, Sn—Pb—Ag, Sn—Cu, Sn—Ag, Sn—Au, Sn—Bi, or Sn—Ag—Cu. Internal interconnects 121 of electronic component 120 can be electrically coupled to leads 111a of substrate 110 through low melting point material 121a. In some examples, internal interconnects 121 can have a width or diameter in the range from approximately 10 µm to approximately 150 µm.

Circuitry 122 can face dielectric 112 of substrate 110. Circuitry 122 can be electrically coupled to internal interconnects 121. Circuitry 122 can be electrically coupled to substrate 110 through internal interconnects 121. In some examples, circuitry 122 can comprise or be referred to as a micro-electro mechanical system (MEMS), a sensor, an image sensor, a light sensor, a fingerprint sensor, a photo sensor, a pressure sensor, or a processing circuit. In some examples, circuitry 122 can include an embedded pixel array (not shown) for directly sensing fingerprint information. In some examples, circuity 122 can sense or receive fingerprint information through dielectric 112. In some examples, electronic component 120 can comprise drive and sense electronics for interpreting fingerprint information sensed by circuity 120.

In some examples, circuitry 122 can comprise a transmitter or circuity to transmit signals from electronic component 120 through dielectric 112. In some examples, circuitry 122 can comprise a receiver or circuity to receive signals through dielectric 112. In some examples, circuity 122 can be aligned with dielectric 112 to receive or transmit signals through dielectric 112.

In some examples, dielectric 112 can be clear, translucent, or transparent to permit light or other radiation to pass through and be sensed or received by circuitry 122. In some examples, dielectric 112 and circuity 122 can be arranged to allow circuity 122 to receive or transmit signals through dielectric 112. In some examples, the thickness of electronic component 120 can be in the range from approximately 50 µm to approximately 450 µm.

Figure 2F:
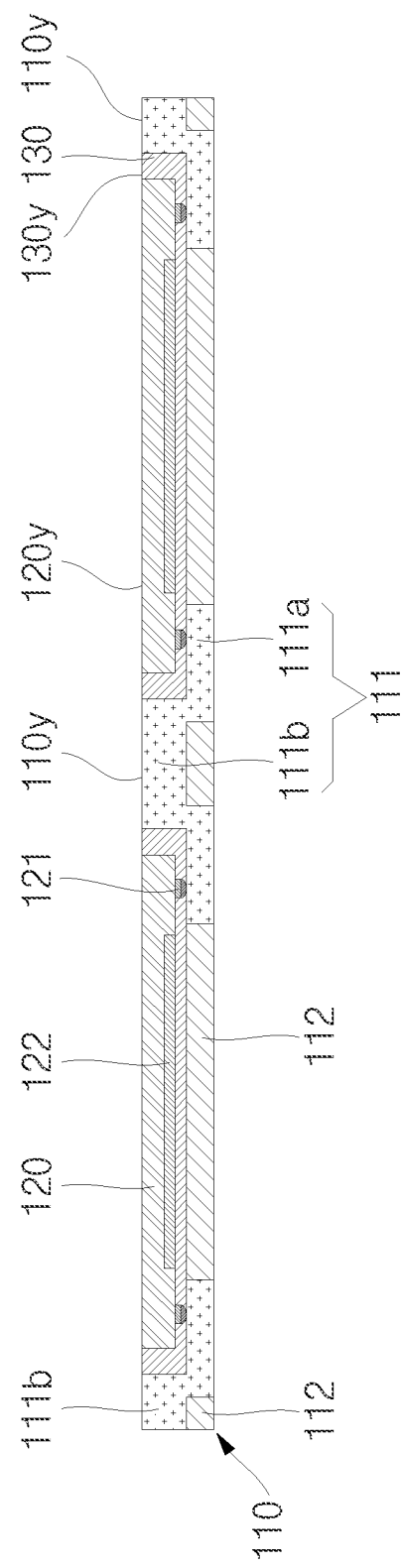

FIG. 2F shows a cross-sectional view of electronic device 100 at a later stage of manufacture. In the example shown in FIG. 2F, dielectric 130 can be located or positioned between electronic component 120 and substrate 110. Dielectric 130 can be formed in cavities 111d of substrate 110. In some examples, dielectric 130 can surround and contact interconnects 121. Side 120y of electronic component 120 can be exposed. Side 120y can be referred to as a top surface of electronic component 120. Side 130y of dielectric 130, side 120y of electronic component 120, and side 110y of substrate 110 can be substantially coplanar. Dielectric 130 can be positioned between side 120x of electronic component 120 and dielectric 112 of substrate 110. In some examples, dielectric 130 can contact side 120z of electronic component 120 and can contact flank 111b. In some examples, dielectric 130 can contact circuitry 122 and can contact dielectric 112. In some examples, dielectric 130 can comprise or be referred to as a molding part, a sealing part, a protection part, or an underfill. In some examples, dielectric 130 can comprise an adhesive, a capillary underfill, a molded underfill, a non-conductive paste, a sealant, a resin or a mold compound. In some examples, dielectric 130 can be clear, translucent, or transparent to permit light or other radiation to pass through and be sensed by circuitry 122. For example, dielectric 130 can comprise a clear, translucent, or translucent adhesive, underfill, non-conductive paste, sealant, resin, or mold compound. In some examples, dielectric 130 can be injected between electronic component 120 and substrate 110. Examples for forming dielectric 130 can comprise using a compression molding process, a transfer molding process, a liquid phase encapsulant molding process, a vacuum lamination process, a paste printing process, or a film assisted molding process. In some examples, dielectric material can be formed simultaneously in multiple cavities 111d of substrate 110. In some examples, dielectric 130 can protect electronic component 120 from physical or chemical shocks so as not to be electrically disconnected from substrate 110.

Although electronic device 100 is shown as comprising dielectric 130, this is not a limitation of the present disclosure. In some examples, electronic device 100 can be formed using a leadframe comprised of an electrically conductive material and openings and a molding process can be used to form a translucent, transparent, or clear material in the openings of the leadframe. In some examples, electronic device 100 comprises a single integral translucent material, and the translucent material and circuity 122 can be arranged to allow circuity 122 to receive or transmit signals through the translucent material. In some examples, the integral translucent material can contact circuitry 122. In some examples, the integral translucent material can be spaced apart from circuitry 122.

FIG. 2G shows a cross-sectional view of electronic device 100 at a later stage of manufacture. In the example shown in FIG. 2G, external interconnects 140 can be provided on side 111by of flank 111b. External interconnect 140 can be electrically connected to side 111by of flank 111b. External interconnect 140 can be electrically connected to internal interconnect 121 and electronic component 120 through flank 111b and lead 111a of conductive structure 111.

In some examples, external interconnect 140 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, external interconnect 140 can be formed using a ball drop process, a screen printing process or an electroplating process. In some examples, external interconnects 140 can be formed on a conductive material (not shown) comprising a solder that can be located on side 111b y using a ball drop process followed by a reflow process. In some examples, external interconnects 140 can comprise or be referred to as conductive balls, solder balls, conductive pillars, copper pillars, or conductive posts having solder caps on copper pillars. In some examples, external interconnects 140 can have a spherical shape and can have a diameter ranging from approximately 25 μm to approximately 300 μm. In some examples, external interconnects 140 can have a height ranging from approximately 25 μm to approximately 300 μm and can have a width ranging from approximately 25 μm to approximately 300 μm.

FIG. 2H shows a cross-sectional view of electronic device 100 at a later stage of manufacture. In the example shown in FIG. 2H, substrate 110 can be separated into individual electronic devices 100 using a singulation process. In some examples, substrate 110 can be separated by removing at least a portion conductive structure 111 of substrate of 110 using, for example, a saw. During the singulation process, portions of flank 111b and dielectric 112 can removed. In some examples, the singulation process can comprise using a diamond wheel, a saw, a laser beam, or an etching process to remove portions of flank 111b and dielectric 112. After the singulation process, electronic device 100 can comprise substrate 110, electronic component 120, dielectric 130, and external interconnects 140. In some examples, external interconnects 140 can comprise or be referred to as external input/output terminals of electronic device 100.

Figure 3:
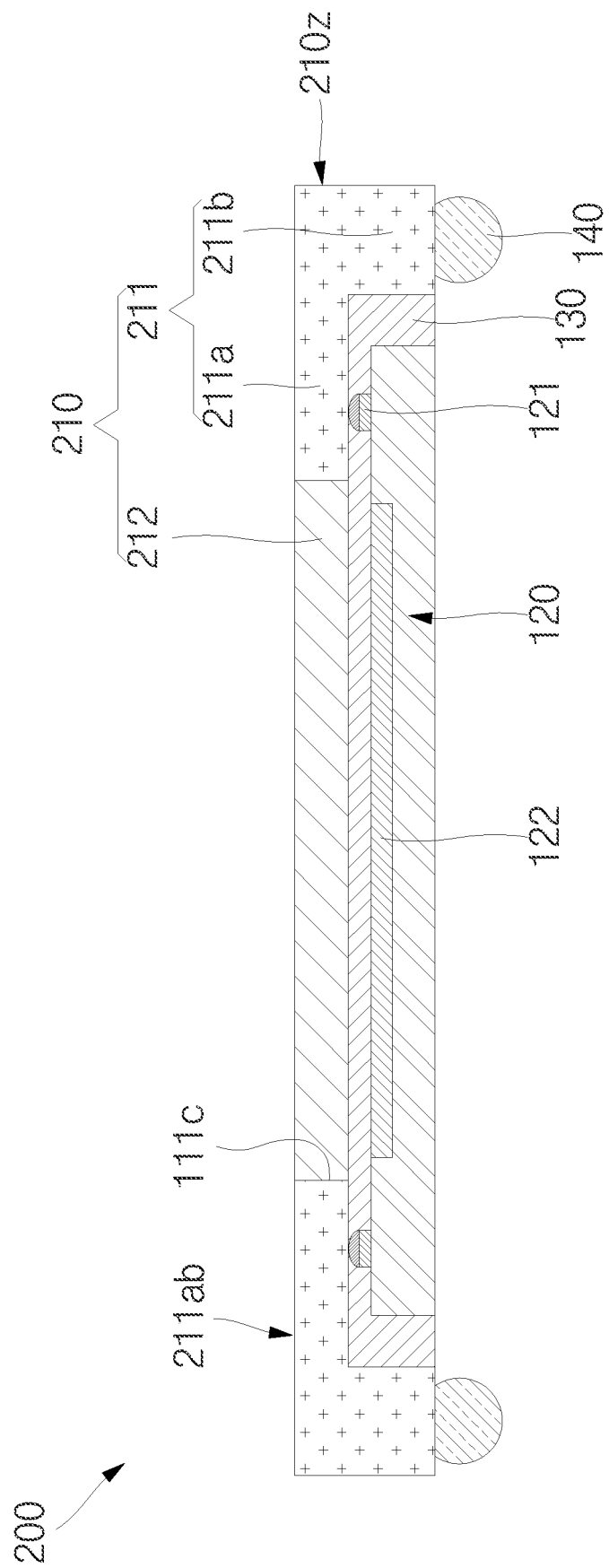
FIG. 3 shows a cross-sectional view of an example electronic device.
Figure 3A:
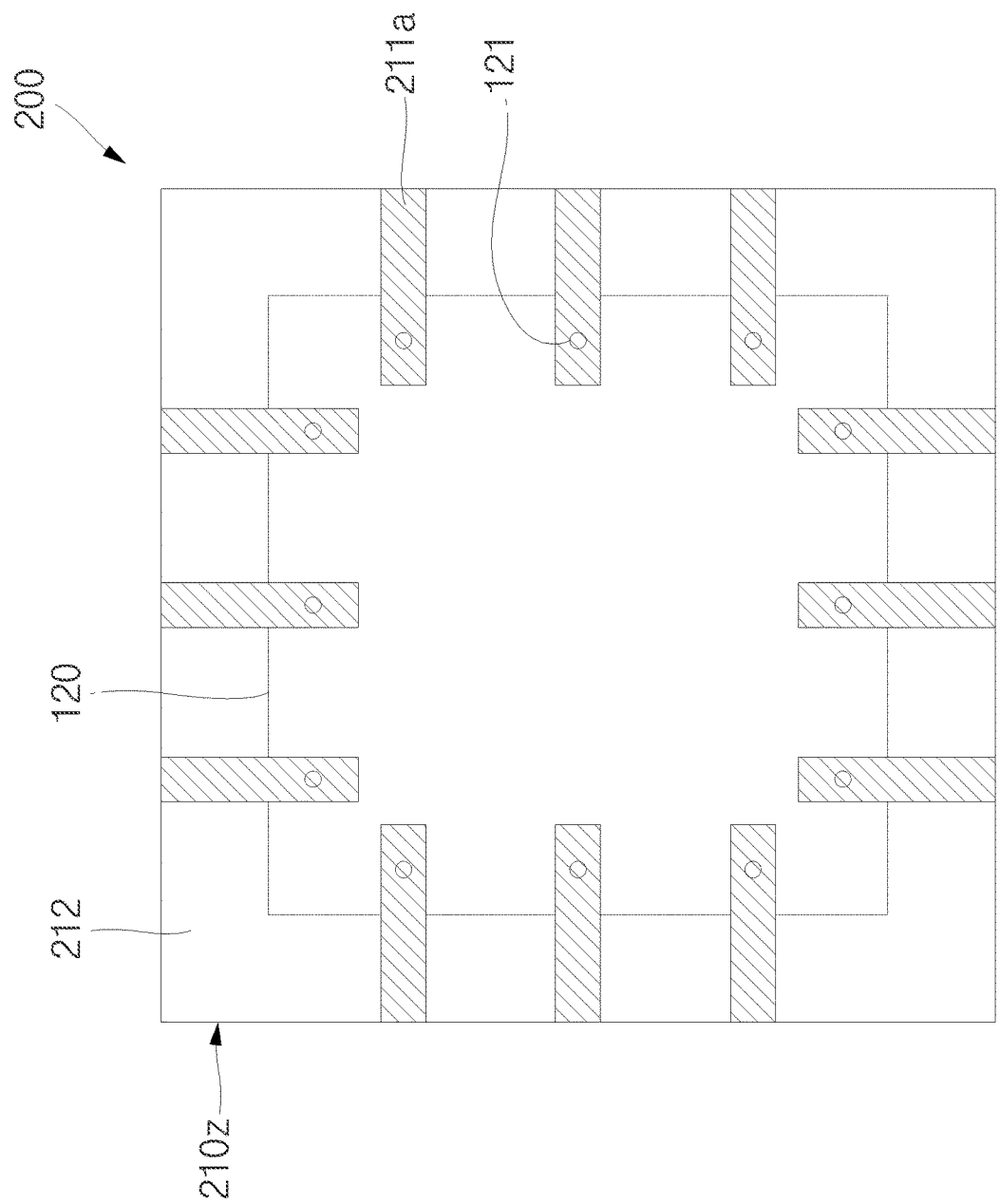
FIG. 3A shows a top view of the example electronic device of FIG. 3.

FIG. 3 shows a cross-sectional view of an example electronic device 200. FIG. 3A shows a top view of the example electronic device of FIG. 3. In the example shown in FIG. 3, electronic device 200 can comprise substrate 210, electronic component 120, dielectric 130 and external interconnects 140.

Electronic device 200 can be similar to electronic device 100 previously described. For example, the manufacturing process and configuration of substrate 210 can be the same or similar to those of substrate 110 shown in FIGS. 1 and 2A to 2D. For example, conductive structure 211 and dielectric 212 can be the same or similar to conductive structure 111 and dielectric 112 of electronic device 100 shown in FIG. 1. Conductive structure 211 can include conductor 211ab comprising lead 211a and flank 211b. Multiple leads 211a and multiple flanks 211b of conductive structure 211 can be the same or similar to multiple leads 111a and multiple flanks 111b of electronic device 100 shown in FIG. 1. In some examples, multiple leads 211a can extend to be exposed at lateral side 210z of substrate 210. Dielectric 212 can be positioned between multiple leads 211a.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A method to manufacture an electronic device, the method comprising:
   forming a first cavity by removing a first portion of an electrically conductive material;
   forming a first translucent material in the first cavity;
   forming a second cavity by removing a second portion of the electrically conductive material, wherein the first translucent material in the first cavity is exposed from the second cavity when the second cavity is formed;
   placing a first electronic component in the second cavity, wherein the first electronic component comprises a sensor and an electrical interconnect; and
   forming a second translucent material in the second cavity covering the electrical interconnect of the first electronic component and between the sensor of the first electronic component and the first translucent material.

2. The method of claim 1, further comprising:
   forming a third cavity by removing a third portion of the electrically conductive material;
   forming a third translucent material in the third cavity;
   forming a fourth cavity by removing a fourth portion of the electrically conductive material;
   placing a second electronic component in the fourth cavity, wherein the second electronic component comprises a sensor and an electrical interconnect; and
   forming a fourth translucent material in the fourth cavity contacting the electrical interconnect of the second electronic component and between the sensor of the second electronic component and the third translucent material.

3. The method of claim 2, wherein the forming of the first translucent material is performed simultaneously with the forming of the third translucent material and wherein the forming of the second cavity is performed simultaneously with the forming of the fourth cavity.

4. The method of claim 2, further comprising:
forming a solder ball coupled to the electrically conductive material; and
removing a fifth portion of the electrically conductive material after the forming of the solder ball, wherein the removing the fifth portion comprises using a saw.

5. The method of claim 1, wherein the first translucent material comprises a translucent mold compound, the second translucent material comprises a translucent underfill, the sensor of the first electronic component comprises a fingerprint sensor, and the electrical interconnect comprises solder.

6. The method of claim 1, wherein the removing the first portion and the removing the second portion comprises using an etch process and the forming the first translucent material comprises using a molding process after the etch process.

7. A method to manufacture an electronic device, the method comprising:
providing a conductive structure having a first side and a second side;
forming a first cavity in the first side of the conductive structure;
providing a translucent dielectric in the first cavity;
forming a second cavity in the second side of the conductive structure, wherein the translucent dielectric is exposed through the second cavity when the second cavity is formed;
providing an electronic component in the second cavity and coupled with the conductive structure; and
providing an underfill in the second cavity, wherein the underfill covers a lateral side of the electronic component.

8. The method of claim 7, wherein the electronic component comprises circuitry facing the translucent dielectric.

9. The method of claim 8, wherein the underfill contacts the circuitry of the electronic component.

10. The method of claim 8, wherein the underfill is spaced apart from the circuitry of the electronic component.

11. The method of claim 7, wherein the underfill comprises a translucent material.

12. The method of claim 7, further comprising:
forming a lead comprising a lead flank at a lateral side of the conductive structure when the first cavity is formed.

13. The method of claim 12, wherein the translucent dielectric contacts the lead flank.

14. A method to manufacture an electronic device, the method comprising:
providing a leadframe having a first side and a second side opposite to the first side, and comprising an electrically conductive material, an opening in the first side of the leadframe, a cavity in the second side of the leadframe, and an optical compound in the opening;
providing an electronic component in the cavity adjacent to the optical compound and coupled to the leadframe, wherein the electronic component comprises circuitry at a first exterior side of the electronic component facing the optical compound;
providing an underfill in the cavity of the leadframe and covering a lateral side of the electronic component and contacting the leadframe; and
providing an interconnect between the first side of the leadframe and the first exterior side of the electronic component;
wherein the optical compound in the opening covers the circuitry and is flush with the first side of the leadframe;
wherein the underfill is discrete from the optical compound and extends between the first exterior side of the electronic component and the optical compound;
wherein a portion of the optical compound is exterior to the leadframe, is flush with an exterior lateral side of the leadframe, and is flush with the first side of the leadframe, wherein the lateral side of the leadframe is perpendicular to the first side of the leadframe; and
wherein the circuitry is exposed through the opening and through the optical compound.

15. The method of claim 14, wherein the underfill comprises a translucent material.

16. The method of claim 14, wherein:
the leadframe comprises a conductor comprising a lead and a lead flank at a lateral side of the leadframe; and
the optical compound contacts the lead flank.

17. The method of claim 14, wherein the optical compound comprises a translucent material, a transparent material, or a clear material.

18. The method of claim 14, wherein the underfill is exposed from one side of the leadframe.

* * * * *